United States Patent [19]

Sharpe-Geisler et al.

[11] Patent Number: 5,568,066
[45] Date of Patent: Oct. 22, 1996

[54] SENSE AMPLIFIER AND OR GATE FOR A HIGH DENSITY PROGRAMMABLE LOGIC DEVICE

[75] Inventors: Bradley A. Sharpe-Geisler, San Jose; Fabiano Fontana, Santa Clara, both of Calif.

[73] Assignee: Advanced Micro Devices, Inc., Sunnyvale, Calif.

[21] Appl. No.: 341,432

[22] Filed: Nov. 17, 1994

[51] Int. Cl.$^6$ .................................................. H03K 19/173
[52] U.S. Cl. .................. 326/39; 326/44; 327/51
[58] Field of Search .................................. 326/39, 44, 45; 327/51

[56] References Cited

U.S. PATENT DOCUMENTS

| | | | |
|---|---|---|---|
| 4,758,746 | 7/1988 | Birkner | 326/40 |
| 4,769,562 | 9/1988 | Ghisio | 326/45 |
| 4,839,539 | 6/1989 | Takata et al. | 307/465 |
| 4,899,070 | 2/1990 | Ou et al. | 327/51 |
| 5,041,746 | 8/1991 | Webster | 327/51 |
| 5,162,680 | 11/1992 | Norman | 327/51 |
| 5,297,093 | 3/1994 | Coffman | 327/51 |
| 5,332,929 | 7/1994 | Chiang | 307/296.3 |
| 5,410,268 | 4/1995 | Sharpe-Geisler | 327/51 |

FOREIGN PATENT DOCUMENTS

0616432A2   2/1994   European Pat. Off. .

Primary Examiner—Edward P. Westin
Assistant Examiner—Andrew Sanders
Attorney, Agent, or Firm—Fliesler, Dubb, Meyer & Lovejoy

[57] ABSTRACT

A high density programmable logic device (PLD) having sense amplifiers and OR gates configured to increase operation speed and reduce transistor count from previous circuits as well as to provide a selectable power down mode on a macrocell-by-macrocell basis. The sense amplifiers include a single cascode in the data path connecting a product term to the OR gates. The OR gates utilize a plurality of source follower transistors followed by pass gates to provide logic allocation enabling the sense amplifier outputs to be reduced from the 0.0 V–5.0 V CMOS rails to increase switching speed while reducing overall transistor count. Amplifying inverters normally provided in the sense amplifiers to provide the CMOS rail-to-rail switching and which would require complex feedback for providing power down on a macrocell-by-macrocell basis are moved forward into OR output circuits. Power down on a macrocell-by-macrocell basis is provided by selectively sizing the amplifying inverters in the OR output circuits.

21 Claims, 10 Drawing Sheets

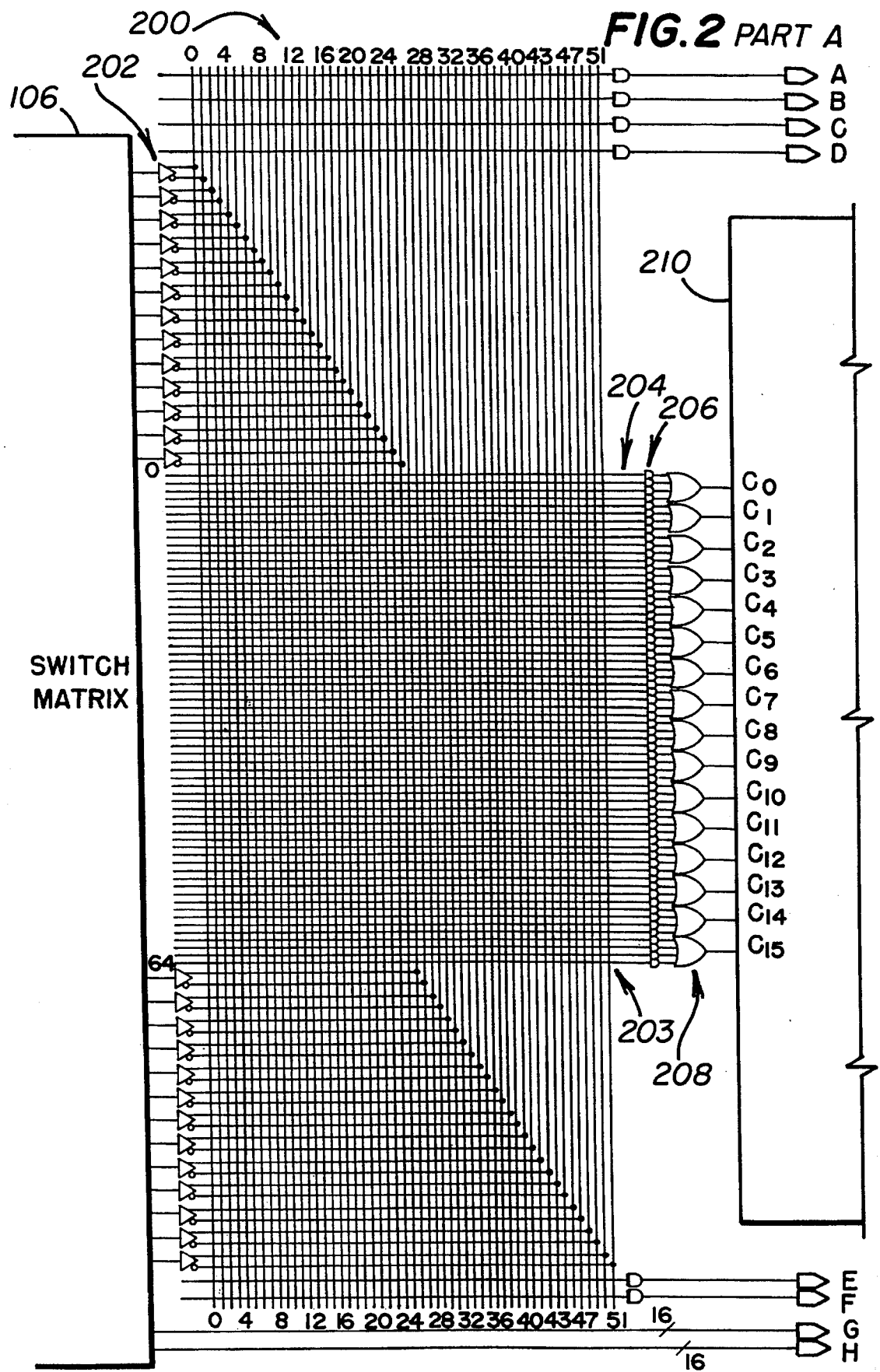
FIG. 2 PART A

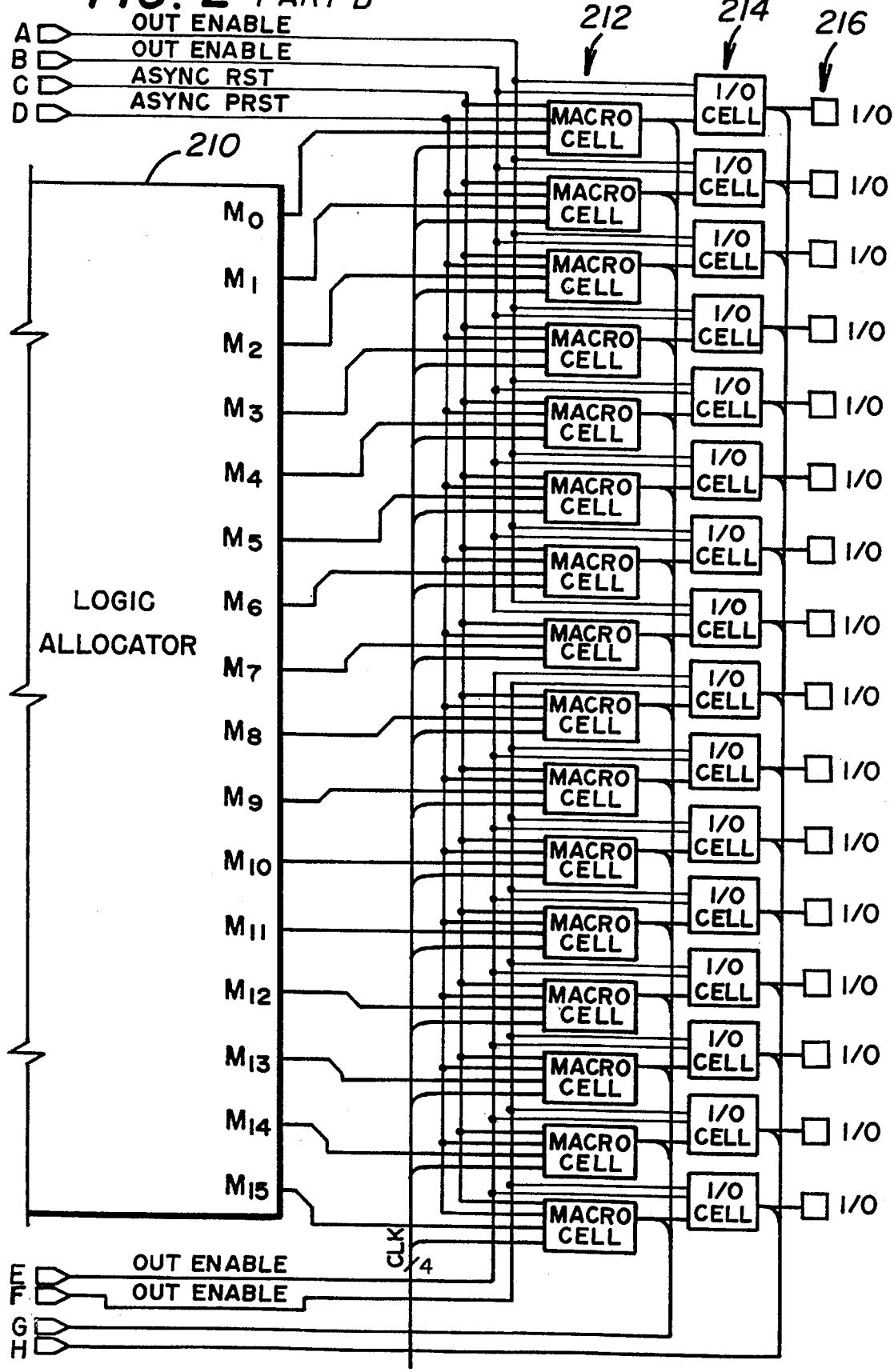
FIG. 2 PART B

LOGIC ALLOCATION

| OUTPUT MACROCELL | AVAILABLE CLUSTERS |
|---|---|
| $M_0$ | $C_0, C_1$ |
| $M_1$ | $C_0, C_1, C_2$ |
| $M_2$ | $C_1, C_2, C_3$ |
| $M_3$ | $C_2, C_3, C_4$ |
| $M_4$ | $C_3, C_4, C_5$ |
| $M_5$ | $C_4, C_5, C_6$ |
| $M_6$ | $C_5, C_6, C_7$ |
| $M_7$ | $C_6, C_7, C_8$ |
| $M_8$ | $C_7, C_8, C_9$ |
| $M_9$ | $C_8, C_9, C_{10}$ |
| $M_{10}$ | $C_9, C_{10}, C_{11}$ |
| $M_{11}$ | $C_{10}, C_{11}, C_{12}$ |
| $M_{12}$ | $C_{11}, C_{12}, C_{13}$ |
| $M_{13}$ | $C_{12}, C_{13}, C_{14}$ |
| $M_{14}$ | $C_{13}, C_{14}, C_{15}$ |
| $M_{15}$ | $C_{14}, C_{15}$ |

SENSE AMPLIFIER AND OR GATE FOR A HIGH DENSITY PROGRAMMABLE LOGIC DEVICE

BACKGROUND OF THE INVENTION

1. Field of the Invention

The present invention relates to circuitry for implementing sense amplifiers and OR gates in high density programmable logic devices (PLDs) to enable a power down mode.

2. Description of the Related Art

FIG. 1 shows a block diagram for a typical high density PLD such as the MACH130 manufactured by Advanced Micro Devices, Inc. As shown, the high density PLD includes four programmable array logic (PAL) blocks 101–104 interconnected by a programmable switch matrix 106. The PAL blocks 101–104 can be viewed as independent PLD devices on the chip, each similar to the popular lower density 22V10 PAL device, also available from Advanced Micro Devices, Inc. The switch matrix 106 connects the PAL blocks to each other and to all I/O pins 111–114 enabling a device, such as the MACH130, to provide six times the logic capability of the 22V10.

FIG. 2 shows greater detail for one quarter of the PLD block diagram of FIG. 1, including one of PAL blocks 101–104, labeled 200, as connected to switch matrix 106. Note that circuit components such as switch matrix 106 carried forward from FIG. 1 are similarly labeled in FIG. 2, as will be circuit components carried forward in subsequent figures. PAL block 200 receives 26 inputs from the switch matrix 106 in input buffers 202. Input buffers 202 provide signals on lines which are connected by programmable array cells 203 to product term (PT) lines 204, the programmable array cells 203 being located at each junction of the input buffer signal lines and the PT lines. Each PT line is connected to one of 64 sense amplifiers 206.

The outputs of sense amplifiers 206 are connected in groups of four to OR gates 208. To provide wider OR gates than the four input OR gates 208, the outputs of OR gates 208 are provided to inputs C0–C15 of a logic allocator 210 which selectively connects the inputs C0–C15 to outputs M0–M15 connected to sixteen output logic macrocells 212. The OR gates 206 and logic allocator 210 together provide configurable OR gates.

The logic allocator 210 is typically provided in a high density PLD to enhance the configurability of the logic provided, but is not typically provided on a lower density device such as the 22V10. FIG. 3 is a table showing the possible combination of connections of inputs C0–C15 to outputs M0–M15 as provided by logic allocator 210.

Macrocells 212 which receive the outputs M0–M15 of logic allocator 210 are programmable to be either registered or combinatorial. The macrocells 212 may also be configured to be synchronous, or asynchronous as controlled by reset and preset product terms. The outputs of macrocells 212 are providable to I/O cells 214 and may also be fed back to the switch matrix 106.

The I/O cells 214 are tri-state output buffers which may be enabled, or disabled as controlled by a product term. The outputs of the I/O cells may be provided at I/O ports 216 of the PAL block 200 and may also be fed back to the switch matrix 106.

FIG. 4 shows conventional circuitry for one of the sense amplifiers 206 of FIG. 2. Amplification for the sense amplifier is provided by inverter 400. Inverter 400 has an input connected to a PT line and an output connected to inverter 402 which provides buffering for the sense amplifier output. To increase switching speed, clamping is provided to the PT line utilizing transistors 404 and 406 to hold the PT line voltage near the threshold of the transistors of inverter 400. A current source 408 provides current to the PT line with a reference voltage VBSPRF provided to the gate of current source 408 to control its current flow. Circles on transistors, such as transistor 408, indicate a p-channel transistor, while no circle indicates an n-channel transistor.

A product term ground line (PTG) which is provided from programmable array cells 203 to a sense amplifier along with the PT line is connected to a current sink 410. Feedback is provided from the sense amplifier output through series inverters 412 and 414 to switch 416 to turn on an additional current sink 418 to assist current sink 410 when a programmable array cell is initially turned on.

To provide a power down mode, it is desirable to reduce the amount of power required by the sense amplifiers. The most significant amount of power is consumed by inverter 400 and clamping transistors 404 and 406 of the sense amplifier.

To provide a selectable power down mode on a macrocell-by-macrocell basis, a programmable feedback would be required to power down specific sense amplifiers which are programmed to be connected to the selected macrocell. Providing such feedback would be undesirable because of the additional logic circuitry required to provide the feedback, as well as the complex routing paths required on the chip for interconnecting the logic which would be a plumber's nightmare.

FIG. 5A shows conventional logic for implementing one of the OR gates 206 of FIG. 2. As shown OR gate 500 is actually implemented by two two input NOR gates 502 and 504 followed by a NAND gate 506.

FIGS. 5B and 5C show specific circuitry for the NOR gates 502 and 504 and NAND gate 506 respectively from FIG. 5A. As shown in FIGS. 5B and 5C, the NOR gates 502 and 504 and NAND gate 506 each contain four transistors for a total of twelve transistors per OR gate 500. Because the circuitry of FIG. 2 utilizes a significant number of OR gates 206, each utilizing twelve transistors, a significant number of transistors is required for a high density PLD as shown in. FIG. 2. It is, thus, desirable to reduce the number of transistors required to implement the OR gates 206.

Further, with OR gates configured as shown in FIGS. 5A–5C, sense amplifiers driving the inputs of the OR gates should provide a rail-to-rail CMOS voltage swing of 0.0V–5.0V to prevent the OR gates from continually drawing power. However, utilizing sense amplifiers providing a 0.0V–5.0V swing reduces switching speed. It is thus, desirable to configure the OR gates to enable reduction of the 0.0V–5.0V sense amplifier output swing without increasing power consumption.

FIG. 6 shows conventional circuitry for a subset of the internal components of the logic allocator 210 of FIG. 2 as connected to sense amplifiers 204 and OR gates 206. The portion of the logic allocator 210 shown includes the C0–C2 inputs with logic provided for connecting to the M1 output. As indicated in FIG. 3, output M1 can be connected to any combination of inputs C0, C1 and C2. Pass gates 600 are provided between the outputs of OR gates 206 and the inputs of an OR gate 604 to selectively connect one or more of inputs C0–C1 to M1. Switching transistors 602 are provided to connect unselected inputs of OR gate 604 to ground. Dashed lines are provided to show that C0 and C1 connections are also provided to additional pass gates connected to an OR connected to M0, while C1 and C2 connections are provided to additional pass gates connected to an OR gate connected to M2.

The circuitry for logic allocator 210 as shown in FIG. 6 requires a large number of transistors for the pass gates 600, switching transistors 602, and OR gates such as 604 which include twelve transistors each as shown in FIGS. 5A–5C. It is, thus, desirable to reduce the transistor count of the logic allocator.

SUMMARY OF THE INVENTION

The present invention provides a high density PLD with circuitry enabling implementation of a power down mode on a macrocell-by-macrocell basis without requiring complex feedback to the sense amplifiers.

The present invention further increases operation speed by reducing the 0.0V–5.0V CMOS rail-to-rail voltage swing required for the sense amplifier outputs without substantially increasing power consumption in subsequent OR gates.

The present invention further enables reducing the total number of transistors required to implement the OR gates 206 and logic allocator 210 from prior art high density PLDs.

The present invention includes circuitry for sense amplifiers and configurable OR gates utilized in a high density programmable logic device (PLD).

The sense amplifiers of the present invention include a single cascode transistor in a data path connecting a product term (PT) line to configurable OR gates. Complexity in providing powerdown on a macrocell-by-macrocell basis is avoided by moving the amplifying inverters normally provided in sense amplifiers, such as 400 and 402 of FIG. 4, forward to avoid the need for complex feedback circuitry. The sense amplifiers further include clamping circuitry for limiting the voltage swing on the output of the cascode to enable faster switching speeds.

The configurable OR gates of the present invention include source follower transistors followed by pass gates for providing logic allocation. By utilizing source follower transistors connected as described subsequently, the sense amplifier output can have a voltage swing below the CMOS rails without substantially increasing power consumption in the OR gates. Further, by using source follower transistors to provide the OR gates, the transistor count for the configurable OR gate circuitry is significantly reduced from prior art circuitry shown in FIGS. 5A–5C and 6.

The configurable OR gates of the present invention further include OR output circuits which provide signals from the pass gates to individual macrocells. Each OR output circuit includes amplifying inverters, such as inverters 400 and 402 of FIG. 4, normally provided in sense amplifiers which consume significant power. Power down on a macrocell-by-macrocell basis is provided by selectively sizing the amplifying inverters in the OR output circuits to selectively provide greater or lower speed operation. Power down is further provided in the OR output circuits by selectively enabling additional current sources, current sinks and clamping transistors.

BRIEF DESCRIPTION OF THE DRAWINGS

Further details of the present invention are explained with the help of the attached drawings in which:

FIG. 2 shows greater detail for one quarter of the PLD shown in FIG. 1;

DETAILED DESCRIPTION

Figure 7:
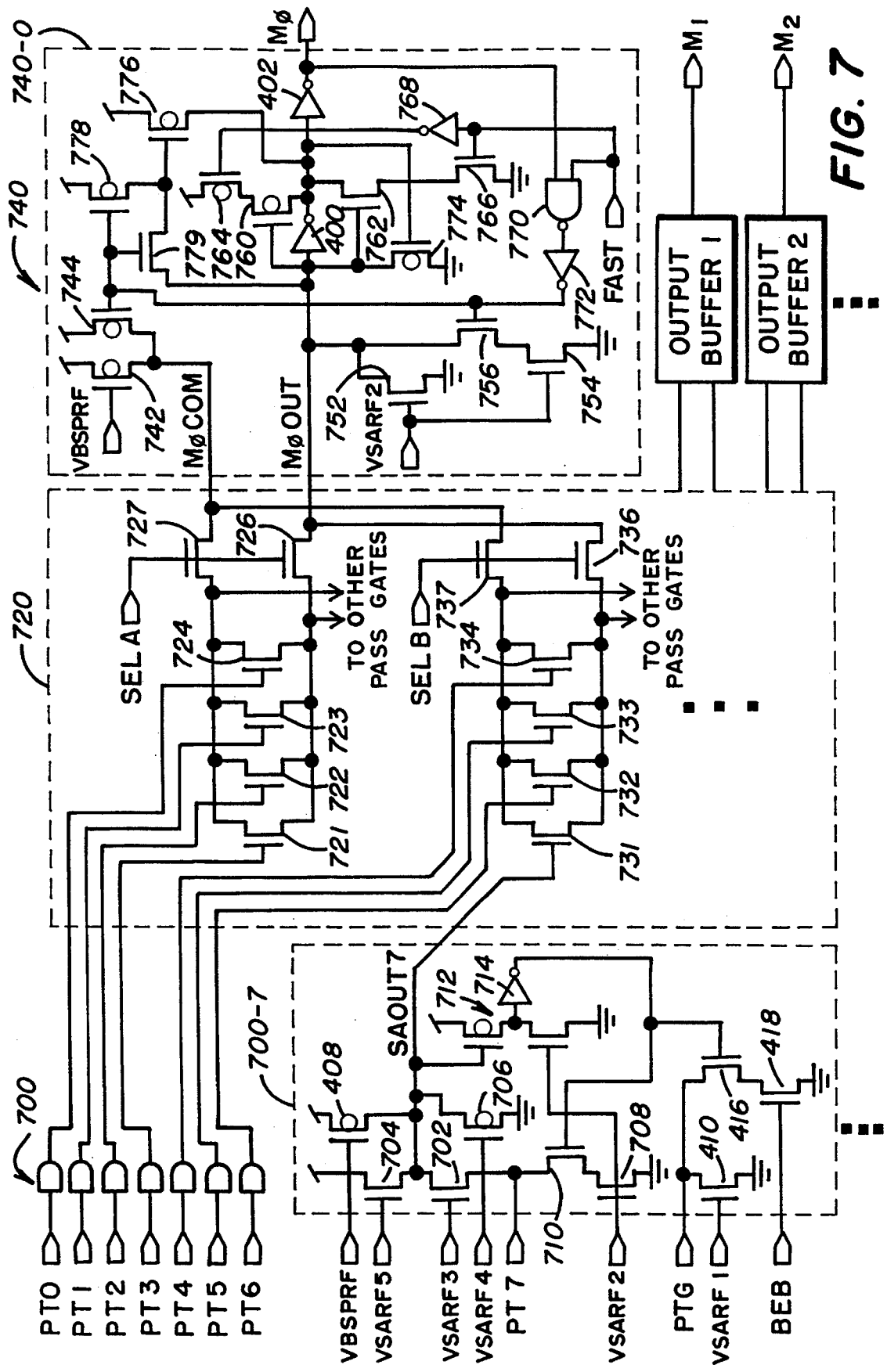
FIG. 7 shows circuitry of the sense amplifiers and configurable OR gates of the present invention.

FIG. 7 shows circuitry of the present invention for implementing the sense amplifiers and configurable OR gates of FIG. 2. FIG. 7 includes sense amplifiers 700 and configurable OR gate circuitry including OR input circuit 720 and OR output circuits 740. The circuitry of FIG. 7 and its operation is described in detail as follows.

Sense Amplifiers 700

Figure 1:
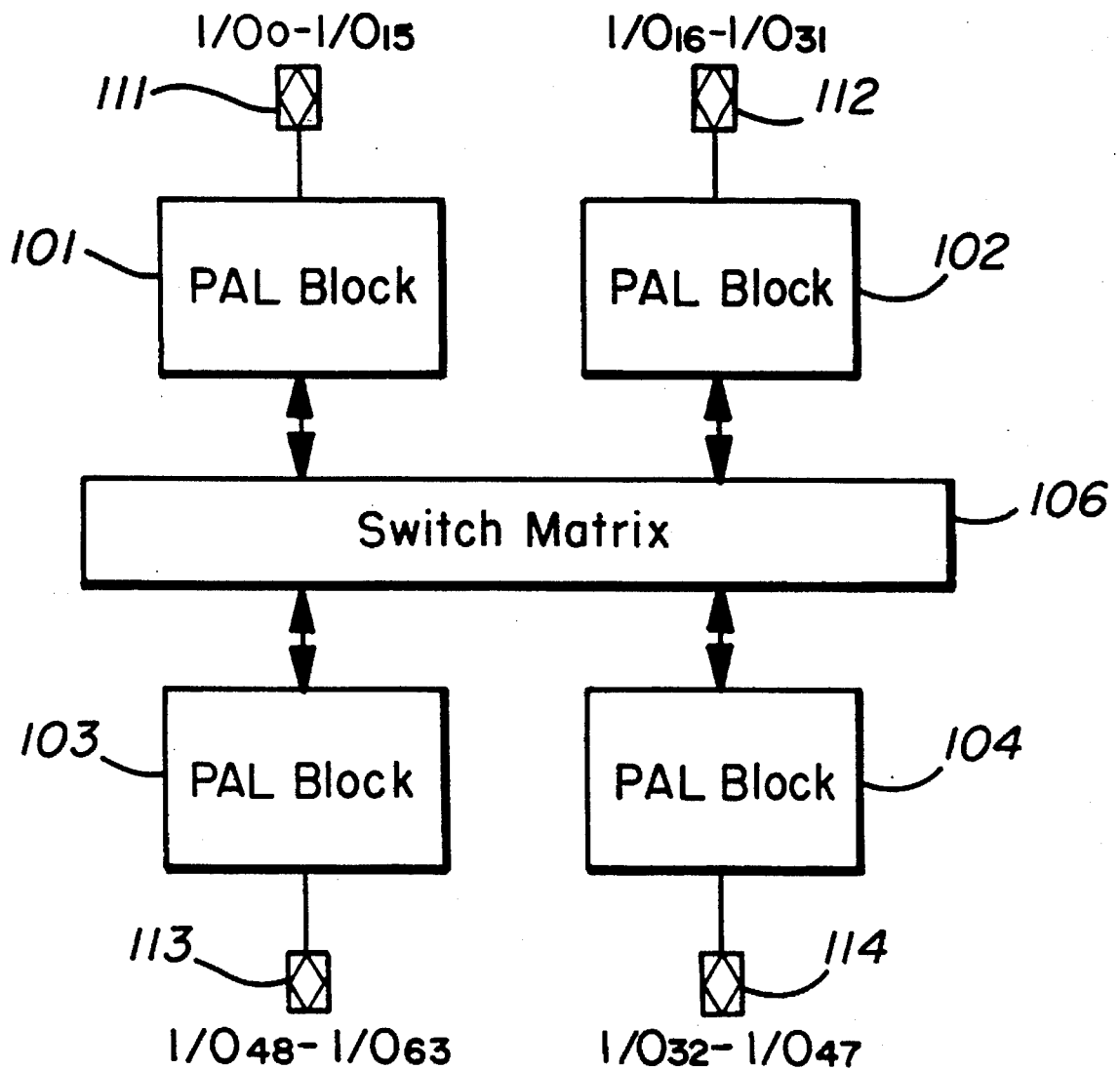
FIG. 1 shows a block diagram for a typical high density programmable logic device (PLD)
Figures 3, 4:
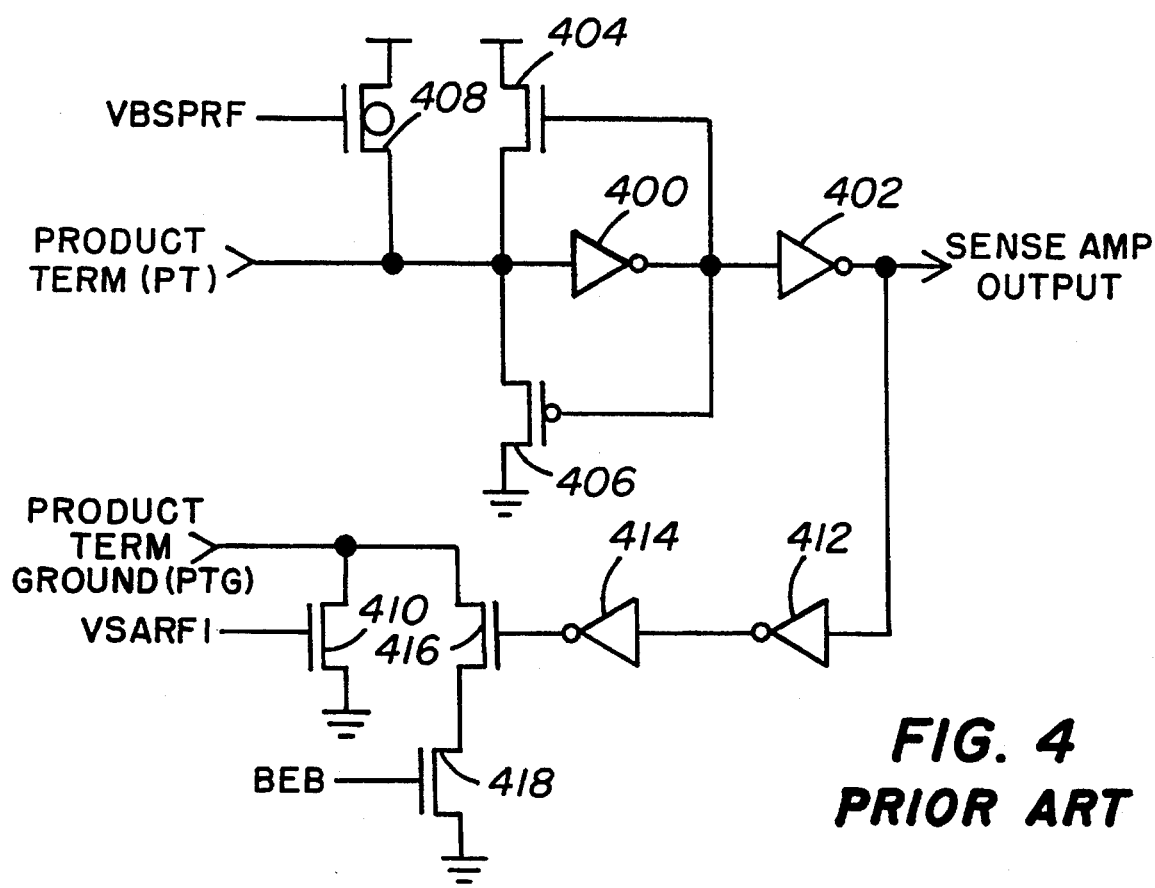
FIG. 3 is a table showing the possible combination of connections provided by the logic allocator of FIG. 2.
FIG. 4 shows conventional circuitry for one of the sense amplifiers of FIG. 2.

Specific circuitry for the sense amplifiers 700 of FIG. 7 is shown in sense amplifier 700-7. Unlike the circuitry of FIG. 4, the sense amplifier 700-7 includes only a cascode transistor 702 provided in the data path of the product term (PT) line. The inverting amplifier 400 of FIG. 4, which consumes substantial power, as well as buffer 402 of FIG. 4 are moved forward into configurable OR output circuits 740 instead of being included in the sense amplifiers 700. By moving inverters 400 and 402 into the OR output circuits 740, feedback to the sense amplifiers 700 is not required to provide power down on a macrocell-by-macrocell basis.

The cascode transistor 702 has a source connected to a PT line, PT7, a drain forming the sense amplifier output SAOUT7, and a gate connected to a voltage reference VSARF3.

A cascode transistor is a transistor defined by being turned on and off by varying voltage applied to the source with the gate voltage fixed, rather than varying the gate voltage. In a cascode transistor with $(v_g - v_s) > v_t$, wherein $v_g$ is the gate voltage, $v_s$ is the source voltage, and $v_t$ is the threshold voltage, the cascode transistor will turn on. With $(v_g - v_s) < v_t$, the cascode transistor will turn off.

Figure 5A:
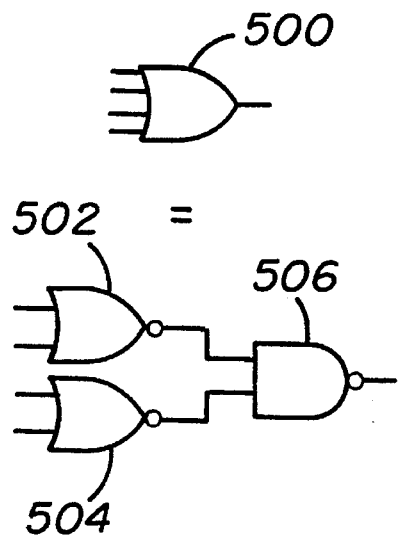
FIG. 5A shows conventional logic for implementing one of the OR gates of FIG. 2.
Figure 5B:
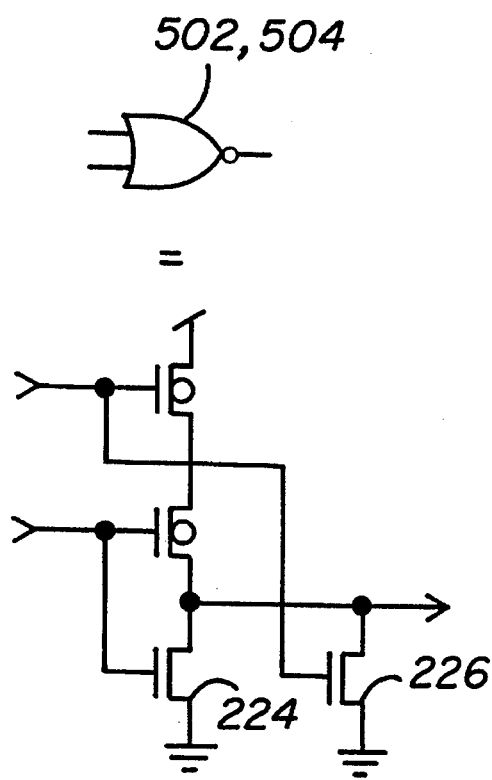
FIG. 5B shows circuitry for the NOR gates of FIG. 5A.
Figure 5C:
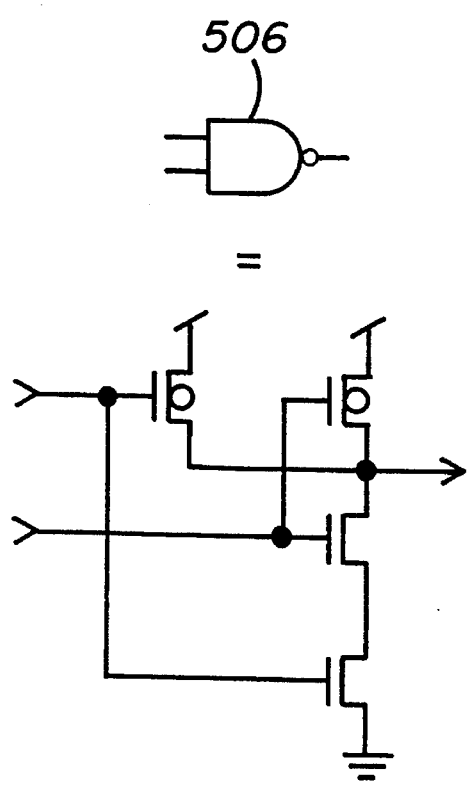
FIG. 5C shows circuitry for the NAND gates of FIG. 5A.

To enable fast switching, the sense amplifier output, SAOUT7, is not driven rail to rail, but has a limited voltage swing. A suggested voltage range is from 2.5 V to 4.0 V, rather than the typical $V_{SS}$ to $V_{DD}$ rail-to-rail voltage swing of 0.0 V to 5.0 V. Note, however, that providing a voltage swing of 2.5 V to 4.0 V at the sense amplifier output SAOUT7 will cause substantial power to be consumed by subsequent OR gates if the OR gates are configured as shown in FIGS. 5A–5C. However, the configurable OR gates of the present invention do not substantially increase power consumption with an input voltage swing of 2.5 V to 4.0 V.

Clamping to the 2.5 V to 4.0 V limits is provided in sense amplifier 700-7 by transistors 704 and 706. Transistor 704 provides current to the drain of cascode 702 to keep the sense amplifier output SAOUT7 from going too low. The current provided by transistor 704 is controlled by reference voltage VSARF5 provided to its gate. Transistor 706 sinks current from the drain of cascode 702 to keep the sense amplifier output SAOUT7 from going too high. The current provided by transistor 706 is controlled by reference voltage VSARF4 provided to its gate.

Clamping to the 2.5 V to 4.0 V limits is made faster by choosing cascode 702 to provide a gain such that the voltage swing on the PT line will be amplified to a greater voltage swing at the sense amplifier output SAOUT7 which will increase the effectiveness of the clamping transistors 704 and 706 to limit the voltage swing on the PT line. Additionally, the voltage reference VSARF3 applied to the gate of cascode transistor 702 is set to turn off the cascode transistor 702 when a voltage on the PT line, PT7, is within a few tenths volts of the 2.5 V limit.

Clamping is further made faster utilizing a current sink transistor 708 connected to the PT line as controlled by a voltage reference VSARF2 provided to its gate as well as a switching transistor 710. Feedback from the sense amplifier output, SAOUT7, is provided to a switching transistor 710 to connect current sink 708 only for a short period when an array cell initially turns on. Current sink transistor 708, therefore, assists the PT line in pulling down the sense amplifier output SAOUT7 more rapidly.

As in FIG. 4, the sense amplifier 700-7 of FIG. 7 further includes a current source transistor 408 controlled by a voltage reference VBSPRF. Further as in FIG. 4, a current sink 410 is connected to the product term ground (PTG) line, and the gate of current sink 410 is controlled by voltage reference VSARF1. A current sink 418 is further connected to the PTG line by switching transistor 416 to assist current sink 418 when an array cell initially turns on. As with transistor 710, the gate of transistor 416 is controlled by feedback from the sense amplifier output SAOUT7. Feedback for switching transistors 710 and 416 is provided by inverters 712 and 714, similar to inverters 412 and 414 of FIG. 4. Unlike FIG. 4, however, the pull down transistor of inverter 712 has a gate connected to VSARF2 to enable inverter 712 to switch states with the limited 2.5 V to 4.0 V swing of SAOUT7.

In operation we initially assume that all cells have been off for some time. With all cells off, current source transistor 408 will pull up the sense amplifier output SAOUT7 above 2.5 V causing cascode 702 to turn off. VSARF2 is set so that current sink 708 sinks less current than current source transistor 408 sources, so with SAOUT7 high and transistor 710 on, cascode 702 will remain off, but transistor 708 will be enabled to operate when a cell turns on. SAOUT7 is held at the 4.0 V rail by clamping transistor 706 which counteracts current sourced by transistor 408 to hold SAOUT7 at 4.0 V. With SAOUT7 high, transistor 416 will be turned on enabling current sink 418 to operate when a cell turns on.

We next assume that one or more cells turn on. With a cell turning on, the PT line will be pulled low and the cell will draw current to the PTG current sink transistors 410 and 418 adding to the current drawn by transistor 708. The drop in voltage of the PT line will turn on cascode 702 to pull the sense amplifier output SAOUT7 low. SAOUT7 is held at the 2.5 V rail by clamping transistor 704 which counteracts current sink 410 to hold SAOUT7 at 2.5 V. With SAOUT7 low, switching transistors 710 and 416 will turn off to disable current sinks 708 and 418 to reduce power consumption and enable faster turn on of cascode 702 when all cells go off. Because the PTG current sink transistor 410 is a stronger current sink than current source transistor 408, the sense amplifier output SAOUT7 remains low as long as a cell is on.

We next assume that all cells are turned back off. With all cells off, the PT line will be pulled up by current source transistor 408 causing cascode 702 to turn off. Current source 408 acting with clamping transistor 706 will hold SAOUT7 high at a 4.0 V level. A short time after SAOUT7 goes high, inverters 712 and 714 turn on transistors 710 and 416 to prepare for a cell to turn on again. At this point, we have returned to the initial condition of the sense amplifier described above.

Figure 8:
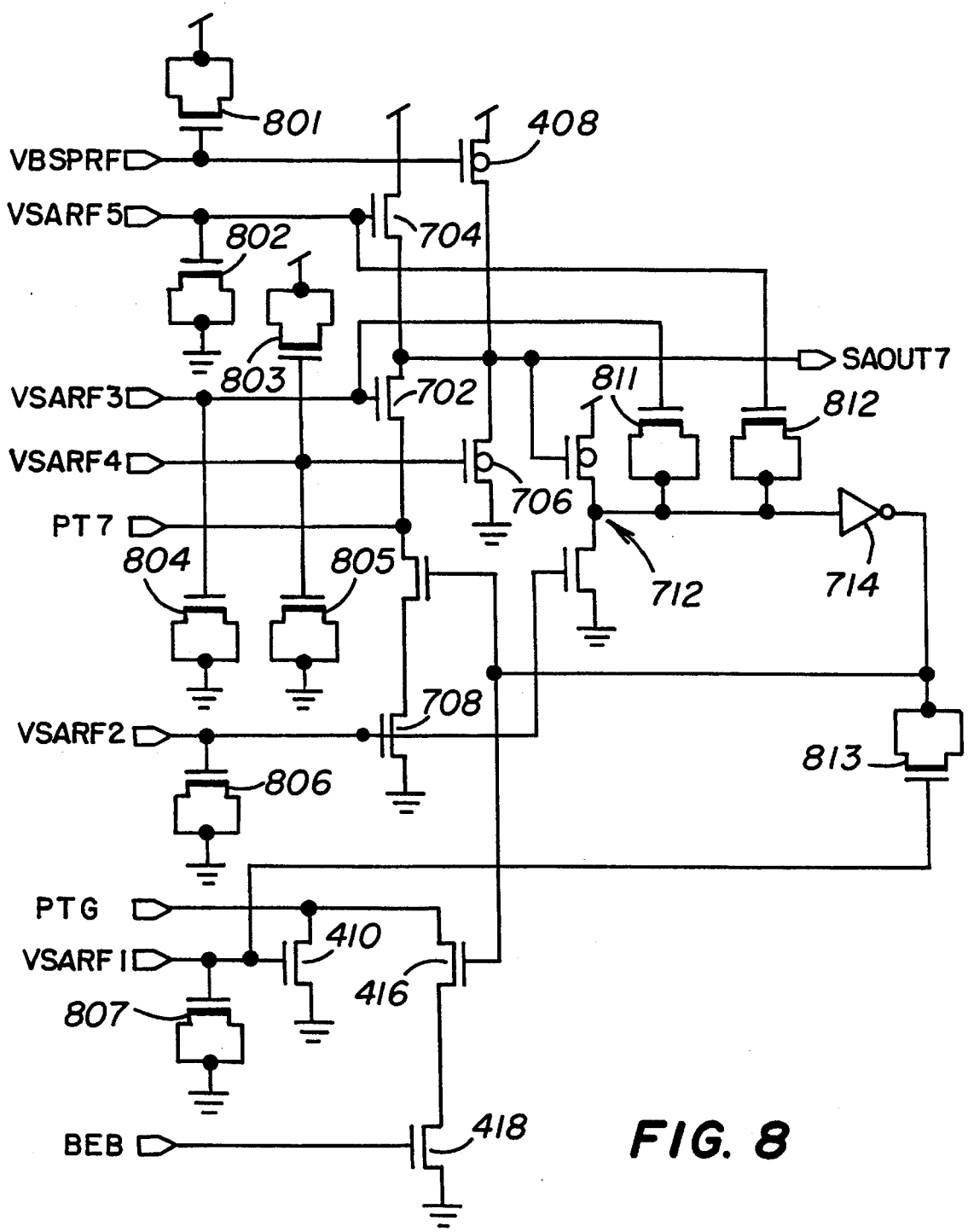
FIG. 8 shows circuitry for the sense amplifiers of FIG. 7 with capacitors added to stabilize decoupling capacitors typically provided on voltage reference lines.

FIG. 8 shows circuitry for sense amplifier 700-7 along with stabilizing capacitors 811–813 added to stabilize decoupling capacitors 801–807 typically provided on the voltage reference lines. Decoupling capacitors 801–807 included on the reference lines are formed from transistors having their source and drains connected together to either $V_{SS}$ or $V_{DD}$ and a gate connected to one of the voltage reference lines. Stabilizing capacitors 811 and 812 are formed from transistors having sources and drains connected together to the input of inverter 714 and gates connected to one of respective reference lines VSARF5 and VSARF3. Stabilizing capacitor 813 is formed from a transistor having a source and drain connected to the output of inverter 714 and a gate connected to reference line VSARF1.

Configurable OR Gates

The configurable OR gates of FIG. 7 include OR input circuit 720 and OR output circuits 740. The OR input circuit 720 includes circuitry providing the function of four input OR gates 208 as well as circuitry providing the function of logic allocation circuitry 210 of FIG. 2. The OR output circuits 740 enable providing power down on a macrocell-by-macrocell basis. Circuitry and operation of the OR input circuit 720 and OR output circuits 740 is described in detail below.

OR Input Circuit 720

The OR input circuit 720 initially includes groups of source follower transistors providing the function of the four input OR gates 208 of FIG. 2. By utilizing source follower transistors connected as described below, the 2.5 V–4.0 V range of the sense amplifiers will not substantially increase power consumption, unlike with the OR gate circuitry shown in FIGS. 5A–5C. Thus, sense amplifiers can utilize a cascode without additional inverters, such as 400 and 402 of FIG. 4, and provide reduced switching time.

In the OR input circuit 720, one OR gate includes source follower transistors 721–724. A second OR gate includes source follower transistors 731–734. Transistors 721–724 are connected with common drains and common sources. Likewise, transistors 731–734 are connected with common drains and common sources. Each gate of transistors 721–724 and 731–734 is connected to the output of a sense amplifier. For instance, transistor 731 is connected to the output of sense amplifier 700-7, SAOUT7. Although four input OR gates are formed by four source follower transistors, OR gates with greater than four inputs may be provided by using additional source follower transistors.

Figure 6:
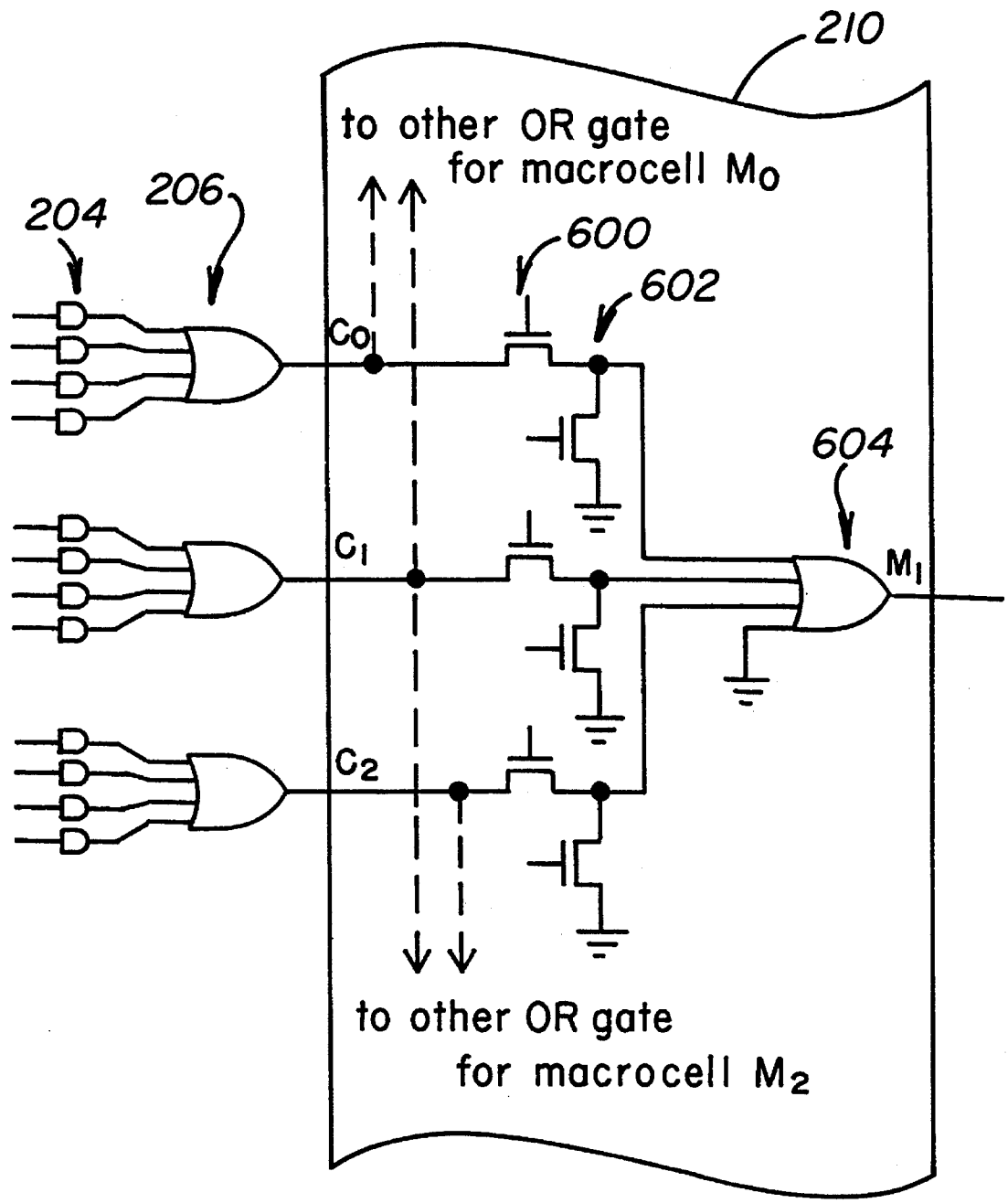
FIG. 6 shows conventional circuitry for a subset of the internal components of the logic allocator of FIG. 2.

Logic allocation, similar to that provided by logic allocation circuitry 210 of FIG. 6 is provided by pass gates 726 and 736. Pass gate 726 has a current path connected on one end to the sources of transistors 721–724, while a second end of the current path is connected to an input $M_0$OUT of an OR output circuit 740-0 which provides an output to a macrocell at $M_0$. Pass gate 736 has a current path connected on one end to the sources of transistors 731–734, while a second end of its current path is also connected to $M_0$OUT. To allocate the outputs of individual OR gates to several macrocells, as indicated in FIG. 3, the sources of transistors 721–724 and 731–734 are also connected to other pass gates (connections not shown) which go to other of OR output circuits 740 which connect to additional macrocell inputs $M_N$.

To provide power, current is provided to the source follower transistors 721–724 and 731–734 from the OR output circuits 740 through pass gates such as 727 and 737. Pass gate 727 has a current path connected on one end to the drains of transistors 721–724, while a second end of the current path forms a connection to a current source connection $M_0$COM of OR output circuit 740-0. Pass gate 737 has a current path connected on one end to the drains of transistors 731–734, while a second end of its current path is connected to the current source connection $M_0$COM.

As illustrated, the OR input circuit 720 can include other pass gates to connect OR gates 721–724 and 731–734 to additional OR output circuits 740. Also OR gates in addition to those formed by transistors 721–724 and 731–734 may also be included in the OR output circuit 720.

Control of pass gates in the logic allocation circuit 720 is provided by signals such as SELA provided to the gates of pass gates 726 and 727 and signal SELB provided to the gates of pass gates 736 and 737. Programmable cells (not shown) provide signals such as SELA and SELB to connect specific source follower transistor groups such as 721–724 and 731–734 to a particular one of the OR output circuits 740.

Pass gates, such as 727 and 737, are utilized to provide current supplied by an OR output circuits 740 to all connected source follower transistors on a single $M_N$COM line to control voltage variations on its $M_N$OUT line. By utilizing current sources connected directly to the drains of source follower transistors such as 721–724, rather than relying on current supplied from OR output circuits 740 through pass gates such as 727 and 737, current supplied on an $M_N$OUT line would increase as more source follower transistors were connected causing a similar increase in voltage on the $M_N$OUT line. Such voltage variations on the $M_N$OUT line would result in increased switching time for the OR output circuits 740.

Operation of the OR input circuit 720 will be described with respect to one OR gate formed using transistors 721–724 and connected pass transistors 726 and 727, with other OR gates operating in a similar manner.

We first assume that the outputs of all sense amplifiers connected to transistors 721–724 are all low and that pass gates 726 and 727 are enabled by a high SELA. Because the maximum voltage provided at the sources of the n-channel source follower transistors 721–724 equals the gate to source voltage of an individual transistor, which varies as the sense amplifier output from 2.5 V to 4.0 V minus a threshold of approximately 0.7 V, the maximum voltage provided on $M_0$OUT with all sense amplifiers low will be approximately 1.8 V. $M_0$OUT will be pulled up to the maximum of 1.8 V by current supplied on the $M_0$COM line.

We next assume that one or more sense amplifier outputs connected to transistors 721–724 is high and that pass gates 726 and 727 are enabled by a high SELA. With one or more sense amplifiers providing a high, or 4.0 V output, the maximum voltage provided on $M_0$OUT will be approximately 3.3 V. $M_0$OUT will be pulled up to a maximum of 3.3 V by current supplied on the $M_0$COM line.

With pass gates 726 and 727 being disabled by a low SELA, no current can be provided from the $M_0$COM line to the $M_0$OUT line through transistors 721–724 and the $M_0$OUT line remains unaffected by the state of specific sense amplifiers connected to transistors 721–724.

Figure 9:
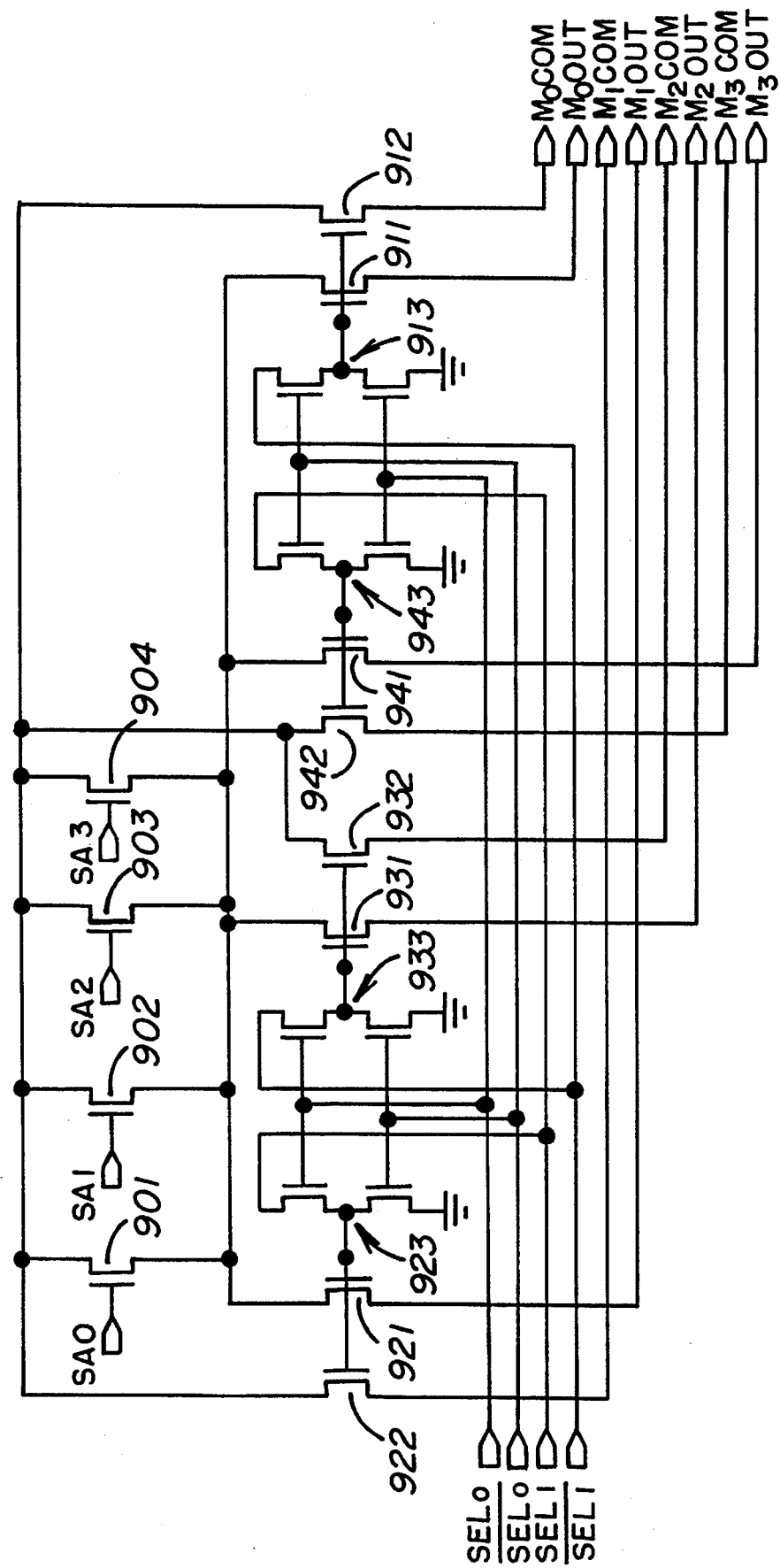
FIG. 9 shows a portion of the configurable OR gates of FIG. 7 including a four input OR gate with additional pass gates provided to selectively connect the four input OR gates to up to four of the OR output circuits.

FIG. 9 illustrates how groups of four source follower transistors in the OR input circuit 720 of FIG. 7 can be connected to one of up to four of the OR output circuits 740. In FIG. 9, a four input OR gate is provided utilizing four source follower transistors 901–904, similar to transistors 721–724 in FIG. 7. As with the source follower transistors of FIG. 7, each of the source follower transistors 901–904 has a gate connected to a sense amplifier output SA0–SA3.

The sources of transistors 901–904 are each connected to a first end of a current path of pass gates 911, 921, 931 and 941. Similarly, the drains of transistors 901–904 are each connected to one end of the current path of pass gates 912, 922, 932 and 942. A second end of each pass gate 911, 921, 931 and 941 is connected to a respective input $M_0$OUT, $M_1$OUT, $M_2$OUT and $M_3$OUT of an OR output circuit. Similarly a second end of each pass gate 912, 922, 932 and 942 is connected to a respective current source connection $M_0$COM, $M_1$COM, $M_2$COM and $M_3$COM of an OR output circuit.

Control of the pass gates of FIG. 9 is provided by select signals SEL0, SEL1 and their complements $\overline{SEL0}$ and $\overline{SEL1}$. The select signals SEL0, SEL1, $\overline{SEL0}$ and $\overline{SEL1}$ are provided to switching transistor pairs 913, 923, 933 and 943. Each of the switching transistor pairs include transistors having current paths with first ends connected together and to the gates of a respective pair of pass gates. For instance, transistor pair 913 provides a connection to pass gates 911 and 912, pair 921 connects to pass gates 921 and 922, pair 931 connects to pass gates 931 and 932, and pair 941 connects to pass gates 941 and 942. The second end of the current path of a lower transistor of each of transistor pairs 913, 923, 933 and 943 is connected to $V_{SS}$. The second end of the current path of an upper transistor of each of transistor pairs 913, 923, 933 are respectively connected to select signals $\overline{SEL1}$, SEL1, $\overline{SEL1}$ and SEL1. The gates of lower transistors of switching transistor pairs 913 and 943 are connected together and to select signal SEL0, while the gates of upper transistors of switching transistor pairs 913 and 943 are connected together and to select signal $\overline{SEL0}$. The gates of upper transistors of switching transistor pairs 923 and 933 are connected together and to select signal SEL0, while the gates of lower transistors of switching transistor pairs 923 and 933 are connected together and to select signal $\overline{SEL0}$.

In operation, the select signals SEL0, SEL1, $\overline{SEL0}$ and $\overline{SEL1}$ are controlled to selectively enable one or more of pass gate pairs (911,912), (921,922), (931,932) and (941,942). The pass gate pairs, thus, selectively connect the source follower transistors 901–904 to one of up to four OR output circuits.

OR Output Circuits 740

The OR output circuits 740 of FIG. 7 convert the outputs the logic allocation circuit 720 to provide rail-to-rail, or 0.0 V–5.0 V outputs to the output logic macrocells. OR output circuits 740 also each receive a FAST signal to enable providing a power down mode on a macrocell-by-macrocell basis. In a high state, the FAST signal triggers a high power, high speed mode and in a low state triggers a low power, lower speed mode. Specific circuitry for the OR output circuits 740 is shown in OR output circuit 740-0 which is described below.

As discussed previously, the data path of OR output circuit 740-0 includes an amplifying inverter 400 and an inverting output buffer 402 similar to those previously included in sense amplifier circuits shown in FIG. 4. The input of inverter 400 is connected to outputs of the logic allocation circuitry 720 on line $M_0OUT$. The output of inverter 402 is provided on line $M_0$ to the input of an output logic macrocell. Transistors of inverter 400 are sized to provide a threshold to switch within the range of voltages provided on the $M_0OUT$ line which may be as high as 1.8 V to 3.3 V as discussed previously. Typically, however, the voltage on the $M_0OUT$ line does not charge up to the 1.8 V to 3.3 V limits and may range from only 1.2 V to 2.2 V, for instance, requiring the threshold of the inverter 400 to be adjusted accordingly.

To supply power to the $M_0COM$ line, output buffer 740-0 includes a current source 742. A current sink transistor 752 is included to pull down the input of inverter 402. Current source 742 is larger than current sink 752 to enable pull up of the input of inverter 400 when the $M_0OUT$ line goes high. The gate of the current source transistor 742 is controlled by the VBSPRF reference voltage, while the gate of current sink transistor 752 is controlled by the VSARF2 reference voltage.

To provide higher speed switching when the FAST signal is high, an additional inverter is provided in parallel with inverter 400. The additional inverter includes pull up transistor 760 and pull down transistor 762. Transistors 760 and 762 each have a gate connected to the input of inverter 400 and a current path connected on one end to the output of inverter 400. Pull up transistor 760 is switched by transistor 764 which has a current path connected on one end to a second end of the current path of transistor 760 and on a second end to $V_{DD}$. Pull down transistor 762 is switched by transistor 766 which has a current path connected on one end to a second end of the current path of transistor 762 and on a second end to $V_{SS}$. The FAST signal is provided to the gate of switching transistor 764 through inverter 768. The FAST signal is provided directly to the gate of switching transistor 766.

To enable faster switching of inverter 400 and the inverter composed of transistors 760 and 762 when the FAST mode is high, a parallel current source 744 and a parallel current sink 754 are provided. The parallel current source 744 is connected directly to the $M_0COM$ line. The second current sink 754 is connected though a switching transistor 756 to the $M_0OUT$ line. The FAST signal is applied along with the output of inverter 402 to the input of a NAND gate 770 which is followed by an inverter 772. The output of inverter 772 is provided directly to the gates of transistors 744 and 756.

To provide clamping to limit the voltage swing of inverter 400 and the inverter composed of transistors 760 and 762 in a FAST mode, transistor 774 is provided. Transistor 774 limits voltage swing during a low to high transition of $M_0OUT$ by providing a current sink to $M_0OUT$ which is controlled by the output of inverter 400. Transistor 774 has a gate connected to the output of inverter 400, a source connected to the input of inverter 400 and a drain connected to $V_{SS}$.

To maintain voltage on the input of inverter 402 close to its threshold to enable faster switching a threshold shifting transistor 776 is provided to supply current to the output of inverter 400 during a high to low transition of $M_0OUT$. Switching of transistor 776 is provided by transistors 778 and 779 connected to its gate. The gates of transistors 778 and 779 are connected to the output of inverter 772. Transistor 778 provides a current path from $V_{DD}$ to the gate of transistor 776. Transistor 779 provides a current path from the input of inverter 400 to the gate of transistor 776.

In operation, we first assume that the FAST mode is off, or the FAST signal is low. With the FAST signal low, switching transistors 764 and 766 will be turned off disabling the inverter composed of transistors 760 and 762 provided in parallel with inverter 400. Additionally, NAND gate 770 will be disabled by a low FAST signal making the output of inverter 772 low, which turns off transistor 756 disabling parallel current sink 754. With the output of inverter 772 low, switching transistor 778 will be on disabling threshold shifting transistor 776. Also with the output of inverter 772 high, parallel current source 744 will remain on.

With the FAST mode off, we also first assume that no source follower transistor on the $M_0OUT$ line is on. In this state, current sources 742 and 744 will provide sufficient current on line $M_0OUT$ to create a maximum voltage of 1.8 V as controlled by current sink 752 to switch the output of inverter 400 high. With the output of inverter 400 high, the output of buffer 402 will switch $M_0$ low. With the output of inverter 400 high, clamping transistor 774 will also remain off.

With the FAST mode off, we next assume a source follower transistor between $M_0COM$ and $M_0OUT$ switches on. In this state, current sourced by current sources 742 and 744 will then increase the voltage on line $M_0OUT$ to a maximum of 3.3 V to switch the output of inverter 400 low. With the output of inverter 400 low, the output of buffer 402 will switch high. With the output of inverter 400 low, clamping transistor 774 will turn on to provide sufficient current to hold the voltage on line $M_0OUT$ near the threshold of inverter 400 to enable fast switching of inverter 400 when $M_0OUT$ switches back low.

We next assume that the FAST mode is switched on, or the FAST signal becomes high. With the FAST signal high, switching transistors 764 and 766 will be turned on enabling the inverter composed of transistors 760 and 762 provided in parallel with inverter 400. Additionally with FAST high, NAND gate 770 will be enabled to switch on when the output $M_0$ goes high. With the output of inverter 772 switching between high and low, the parallel current source 744 and parallel current sink 754 as switched by transistor 756 will turn on and off dependent on the state of $M_0$. Additionally, with the output of inverter 772 switching between high and low, threshold shifting transistor 776 as controlled by switching transistors 778 and 779 will switch on and off dependent on the state of $M_0$.

With the FAST mode on, we also first assume that no source follower transistor on the $M_0OUT$ line has been on for a long period of time. In this state, current sources 742 and 744 will hold $M_0OUT$ to a maximum of 1.8 V as controlled by current sink 752 to switch the output of inverters 400 and 760, 762 high. With the output of inverter 400 high, buffer 402 will switch $M_0$ low and clamping transistor 774 will remain off. With $M_0$ low, the output of inverter 772 will remain low enabling parallel current source 744 and disabling parallel current sink 756 and threshold shifting transistor 776.

With the FAST mode on, we next assume a source follower transistor between $M_0$COM and $M_0$OUT switches on. In this state, current sources 742 and 744 will increase the voltage on line $M_0$OUT to a maximum of 3.3 V to switch the output of inverters 400 and 760, 762 low. With the output of inverter 400 low, the output of inverter 402 will switch $M_0$ high. Also with the output of inverter 400 low, clamping transistor 774 will turn on to provide sufficient current to hold the voltage on line $M_0$OUT near the threshold of inverter 400 to enable fast switching of inverter 400 when $M_0$OUT goes back low. With $M_0$ high and FAST high, the output of inverter 772 will switch to high disabling parallel current source 744 and enabling parallel current sink 756. With parallel current source 744 disabled, current source 742 will still overcome current sinks 752 and 754, but only minimally, enabling the current sinks 752 and 754 to more rapidly pull down $M_0$OUT when all source follower transistors connected to $M_0$OUT turn off. Additionally, with inverter 772 low, switching transistor 778 turns off and switching transistor 779 turns on. However, because $M_0$OUT is currently high, threshold shifting transistor 776 does not change states, but is ready to change states immediately upon a change of the state of $M_0$OUT.

With the FAST mode on, we next assume that all source follow transistors connected to the $M_0$OUT line are turned back off. In this state, current sinks 752 and 754 pull down $M_0$OUT to switch the output of inverters 400 and 760, 762 high. With the output of inverters 400 and 760, 762 high, clamping transistor 774 will turn off. With $M_0$OUT low, threshold shifting transistor 776 will turn on to more rapidly switch inverters 400 and 760, 762. With the output of inverter 400 high, inverter 402 will switch $M_0$ low. With $M_0$ low, the output of inverter 772 will switch to low disabling parallel current sink 754 and enabling parallel current source 744. With parallel current sink 754 disabled, current sources 742 and 744 will provide sufficient current to hold the voltage on line $M_0$OUT near the threshold of the input of inverter 400 to enable fast switching of inverter 400 when a source follower transistor connected to $M_0$OUT turns on. Additionally, with inverter 772 low, switching transistor 779 turns off and switching transistor 778 turns on turning threshold shifting transistor 776 off to reduce power consumption.

Figure 10:
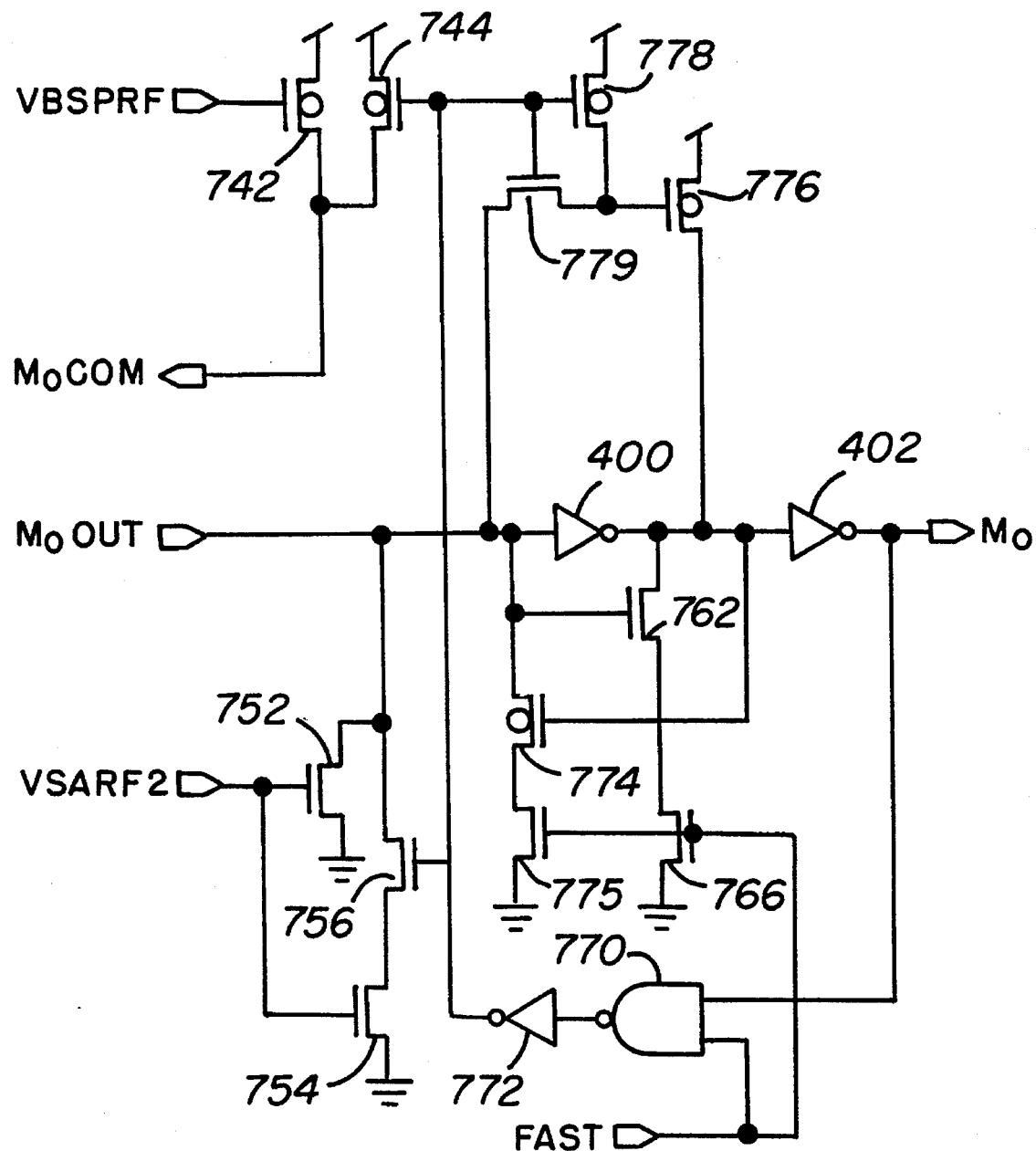
FIG. 10 shows the configurable OR gates of FIG. 7 modified to provide clamping only in a FAST mode to additionally reduce power consumption.

FIG. 10 shows circuitry for OR output circuit 740-0 modified from FIG. 7. The circuitry of FIG. 10 adds transistor 775 to enable clamping transistor 774 only in a FAST mode to additionally reduce power consumption. The source to drain path of transistor 775 now connects the drain of clamping transistor 774 to $V_{SS}$. The gate of transistor 774 is connected to receive the FAST signal.

The circuitry of FIG. 10 further removes inverter 768 and transistors 764 and 760 from the circuitry of FIG. 7, and the pull up transistor of inverter 400 is made larger to compensate for removal of transistor 760. Transistor 760 is combined with inverter 400 rather in FIG. 10 than being connected as controlled by the FAST signal because significant power consumption does not result from transistor 760.

Conclusion

Although the invention has been described above with particularity, this was merely to teach one of ordinary skill in the art how to make and use the invention. Many modifications will fall within the scope of the invention, as that scope is defined by the following claims.

What is claimed is:

1. A programmable logic device (PLD) having inputs provided on product term (PT)lines, an upper power supply $V_{DD}$), a lower voltage supply ($V_{SS}$) and outputs ($M_N$), the PLD comprising:

OR gates having outputs forming the outputs ($M_N$), and inputs; and sense amplifiers, each sense amplifier comprising a cascode transistor having a source connected to one of the PT lines, a gate connected to a reference potential and a drain connected to one of the OR Rate inputs and configured for providing a signal at the given OR gate input which transitions between voltage values having a range less than a range between the upper power supply ($V_{DD}$) and the lower power supply ($V_{SS}$).

2. The PLD of claim 1, wherein the sense amplifiers each further comprise:

a clamping current sink transistor connected to the drain of the cascode to limit the maximum voltage on the sense amplifier output to a value below the upper power supply ($V_{DD}$); and a clamping current source transistor connected to the drain of the cascode to limit the minimum voltage on the sense amplifier output to a value above the lower power supply ($V_{SS}$).

3. The PLD of claim 1 wherein each of the sense amplifiers further comprises:

a current sink transistor having a current path with a first end connected to the lower power supply ($V_{SS}$) and a second end, and having a gate connected to a reference potential;

a pair of series inverters having an input connected to the drain of the cascode and an output; and a current sink switching transistor having a current path with a first end connected to the source of the cascode and a second end connected to the second end of the current sink and having a gate coupled to the output of the pair of series inverters.

4. The PLD of claim 1 wherein each of the PT lines has a corresponding product term ground (PTG) line, each of the sense amplifiers further comprising:

a current sink transistor connected to the PTG line;

a parallel current sink;

a pair of series inverters having an input connected to the drain of the cascode and an output; and a parallel current sink switching transistor having a current path connected between the PTG line and the parallel current sink and a gate connected to the output of the pair of series inverters.

5. The PLD of claim 1 wherein each of the OR gates comprise:

a plurality of source follower transistors having drains connected in common and connectable to a current source, sources connected in common and connectable to one of the outputs ($M_N$) of the PLD and gates, each gate forming one of the inputs of the OR gate.

6. A programmable logic device (PLD) having inputs connectable to product term (PT) lines and outputs ($M_N$), the PLD comprising:

sense amplifiers, each having an input connected to one of the PT lines and an output; and OR gates, each comprising a plurality of source follower transistors having drains connected in common and connectable to a current source, sources connected in common and connectable to one of the outputs ($M_N$) of the PLD and gates, each gate forming one of the inputs of the OR gate.

7. A programmable logic device (PLD) having inputs connectable to product term (PT) lines and outputs ($M_N$), the PLD capable of providing select signals, the PLD comprising:

sense amplifiers, each having an input connected to one of the PT lines and an output; and OR gates, each comprising:

a plurality of source follower transistors having drains connected in common, sources connected in common and gates, each gate connected to one of the sense amplifier outputs; and pass gate pairs, each pass gate pair including a first pass gate having a source to drain path connecting the common sources of the source follower transistors of one of the OR gates to a source connection, and a second pass gate having a source to drain path connecting the common drains of the one of the OR gates to which the first pass gate is connected to a drain connection, the gates of each pair being connected to receive one of the select signals.

8. The PLD of claim 7 further comprising OR output circuits, each OR output circuit comprising:

a first inverter having an input line ($M_N$OUT) connected to one or more of the source connections of the pass gate pairs and an output coupled to one of the outputs ($M_N$) of the PLD, a current sink connected to the input line ($M_N$OUT), and a current source connected to a current source line ($M_N$COM) which is connected to one or more of the drain connections of the pass gate pairs.

9. The PLD of claim 8 wherein each of the OR output circuits further comprises:

a parallel current source transistor connected to the current source line ($M_N$COM) so that when the output of the first inverter is high, the parallel current source is enabled and when the output of the first inverter is low, the parallel current source is disabled.

10. The PLD of claim 8 wherein each of the OR output circuits further comprises:

a parallel current sink transistor connected to the input line ($M_N$OUT) so that when the output of the first inverter is low, the parallel current source is enabled and when the output of the first inverter is high the parallel current source is disabled.

11. The PLD of claim 8 wherein each of the OR output circuits further comprises:

a clamping transistor having a source to drain path connected on a first end to the input line ($M_N$OUT) and coupled on a second end to a lower power supply ($V_{SS}$) and a gate connected to the output of the first inverter.

12. The PLD of claim 8 wherein each of the OR output circuits further comprises:

a second inverter having a first end connected to the output of the first inverter and an output forming one of the outputs ($M_N$) of the PLD; and a threshold shifting transistor having a source to drain path coupling an upper power supply ($V_{DD}$) to the input of the second inverter, the threshold shifting transistor having a gate which is connected to be coupled to the input of the first inverter when the output of the second inverter is high and decoupled from the input of the first inverter when the output of the second inverter is low.

13. A programmable logic device (PLD) having inputs connectable to product term (PT) lines and outputs ($M_N$), the PLD being capable of providing a FAST signal which when active indicates high speed is desired and when inactive indicates low speed is desired, the PLD comprising:

sense amplifiers, each having an input connected to one of the PT lines and an output; and OR gates comprising OR input circuits having inputs connected to the sense amplifier outputs and outputs for providing a logic OR of signals received on the inputs of the OR input circuit and OR output circuits each having an input connected to one or more of the outputs of the OR input circuit and an output forming one of the outputs ($M_N$) of the PLD, the OR output circuits connected to receive the FAST signal and to operate in a high speed high power consumption mode when the FAST signal is active and in a low speed low power consumption mode when the FAST signal is inactive.

14. The PLD of claim 13 wherein each of the OR output circuits comprise:

a first inverter having an input line ($M_N$OUT) forming the input of the OR output circuit and an output coupled to one of the outputs ($M_N$) of the PLD; and a parallel inverter connected to be coupled in parallel with the first inverter when the FAST signal is active and decoupled when the FAST signal is inactive.

15. The PLD of claim 14 wherein the parallel inverters of each of the OR output circuits comprises:

a pull up transistor having a gate connected to the input of the first inverter and a current path having a first end connected to the first inverter output and a second end;

a pull up switching transistor having a gate connected to receive the FAST signal and a current path connected on a first end to an upper power supply ($V_{DD}$) and on a second end to the second end of the pull up transistor;

a pull down transistor having a gate connected to the input of the first inverter and a current path having a first end connected to the first inverter output and a second end; and a pull down switching transistor having a gate connected to receive the FAST signal and a current path connected on a first end to a lower power supply ($V_{SS}$) and on a second end to the second end of the pull down transistor.

16. The PLD of claim 13 wherein each of the OR output circuits comprise:

a first inverter having an input line ($M_N$OUT) forming the input of the OR output circuit and an output coupled to one of the outputs ($M_N$) of the PLD;

a pull down transistor having a gate connected to the input of the first inverter and a current path having a first end connected to the first inverter output and a second end; and a pull down switching transistor having a gate connected to receive the FAST signal and a current path connected on a first end to a lower power supply ($V_{SS}$) and on a second end to the second end of the pull down transistor.

17. The PLD of claim 13 wherein each of the OR output circuits comprise:

a first inverter having an input line ($M_N$OUT) forming the input of the OR output circuit and an output coupled to one of the outputs ($M_N$) of the PLD;

a clamping transistor having a source to drain path connected on a first end to the input line ($M_N$OUT) and having a second end, and a gate connected to the output of the first inverter; and a clamp switching transistor having a gate connected to receive the FAST signal and a source to drain path coupling the lower power supply ($V_{SS}$) to the second end of source to drain path of the clamping transistor.

18. The PLD of claim 13 wherein the OR input circuit comprises groups of source follower transistors, each group having drains connected to a drain connection and sources connected to a source connection and gates, each gate connected to the output of a sense amplifier, wherein each of the OR output circuits comprises:

a first inverter having an input line ($M_N$OUT) connected to the source connection of one of the groups of source follower transistors of the OR input circuit and an output coupled to one of the outputs ($M_N$) of the PLD;

a current sink connected to the input line ($M_N$OUT);

a current source connected to a current source line ($M_N$COM) which is connected to the drain connection of the group of source follower transistors connected to the input line ($M_N$OUT);

a parallel current source connected to be coupled to the current source line ($M_N$COM) when the output of the first inverter is high and the FAST signal is enabled and decoupled from the current source line ($M_N$COM) when the output of the first inverter is low; and a parallel current sink connected to be coupled to the input line ($M_N$OUT) when the output of the first inverter is low and the FAST signal is enabled and decoupled from the input line ($M_N$OUT) when the output of the first inverter is high.

19. The PLD of claim 13 wherein each of the OR output circuits further comprises:

a first inverter having an input line ($M_N$OUT) forming the input of the OR output circuit and an output;

a second inverter having a first end connected to the output of the first inverter and an output forming one of the outputs ($M_N$) of the PLD; and a threshold shifting transistor having a source to drain path coupling the upper power supply ($V_{DD}$) to the input of the second inverter, the threshold shifting transistor having a gate which is connected to be coupled to the input of the first inverter when the output of the second inverter is high and the FAST signal is enabled and decoupled from the input of the first inverter when the output of the second inverter is low.

20. A programmable logic device (PLD) having inputs connectable to product term (PT) lines and outputs ($M_N$), the PLD capable of providing select signals, the PLD comprising:

sense amplifiers, each sense amplifier comprising a cascode transistor having a source connected to one of the PT lines, a gate connected to a reference potential and a drain forming a sense amplifier output;

groups of source follower transistors, each group having drains connected in common, sources connected in common and gates, each gate connected to one of the sense amplifier outputs;

pass gate pairs, each pair including a first pass gate having a source to drain path connecting the sources of one of the groups of source follower transistors to a source connection, and a second pass gate having a source to drain path connecting the drains of the group of source follower transistors to which the first pass gate is connected to a drain connection, the gates of each pair of pass gates being connected to receive one of the select signals; and OR output circuits, each OR output circuit including a first inverter having an input line ($M_N$OUT) connected to one or more of the source connections of the pass gate pairs and an output coupled to one of the outputs ($M_N$) of the PLD, a current sink connected to the input line ($M_N$OUT), and a current source connected to a current source line ($M_N$COM) which is connected to one or more of the drain connections of the pass gate pairs.

21. The PLD of claim 20 wherein the PLD is capable of providing a FAST signal which when active indicates high speed is desired and when inactive indicates low speed is desired, and wherein the OR output circuits are connected to receive the FAST signal and to operate in a high speed high power consumption mode when the FAST signal is active and in a low speed low power consumption mode when the FAST signal is inactive.

* * * * *

UNITED STATES PATENT AND TRADEMARK OFFICE
CERTIFICATE OF CORRECTION

PATENT NO. : 5,568,066
DATED : October 22, 1996
INVENTOR(S) : Sharpe-Geisler, et al.

It is certified that error appears in the above-indentified patent and that said Letters Patent is hereby corrected as shown below:

Col. 12, line 14, after "OR", delete "Rate" and insert --gate--.

Signed and Sealed this

Twenty-fourth Day of December, 1996

Attest:

BRUCE LEHMAN

Attesting Officer     Commissioner of Patents and Trademarks